United States Patent
Nandakumar et al.

(10) Patent No.: US 7,402,535 B2
(45) Date of Patent: Jul. 22, 2008

(54) METHOD OF INCORPORATING STRESS INTO A TRANSISTOR CHANNEL BY USE OF A BACKSIDE LAYER

(75) Inventors: Mahalingam Nandakumar, Richardson, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 271 days.

(21) Appl. No.: 10/902,657

(22) Filed: Jul. 28, 2004

(65) Prior Publication Data

US 2006/0024873 A1 Feb. 2, 2006

(51) Int. Cl.
H01L 21/469 (2006.01)
H01L 21/31 (2006.01)

(52) U.S. Cl. .................. 438/791; 438/778; 438/782

(58) Field of Classification Search .......... 438/778, 438/782, 791
See application file for complete search history.

(56) References Cited

U.S. PATENT DOCUMENTS

| | | | |
|---|---|---|---|
| 6,306,766 B1 * | 10/2001 | Sandhu et al. | 438/683 |
| 6,656,853 B2 * | 12/2003 | Ito | 438/778 |
| 6,806,178 B2 * | 10/2004 | Segawa | 438/598 |
| 7,009,226 B1 * | 3/2006 | Sun | 257/192 |
| 7,053,400 B2 * | 5/2006 | Sun et al. | 257/19 |
| 7,087,474 B2 * | 8/2006 | Mitsuda et al. | 438/197 |
| 7,105,394 B2 * | 9/2006 | Hachimine et al. | 438/197 |
| 7,115,954 B2 * | 10/2006 | Shimizu et al. | 257/369 |
| 7,205,615 B2 * | 4/2007 | Tsutsui et al. | 257/369 |
| 2004/0018392 A1 * | 1/2004 | Yoder | 428/698 |

FOREIGN PATENT DOCUMENTS

JP 408227834 A * 9/1996

* cited by examiner

*Primary Examiner*—M. Wilczewski
*Assistant Examiner*—Khanh B Duong
(74) *Attorney, Agent, or Firm*—Wade J. Brady, III; Frederick J. Telecky, Jr.

(57) ABSTRACT

The present invention provides the method includes forming source/drain regions 170 in a semiconductor wafer substrate 110 adjacent a gate structure 130 located on a front side of the semiconductor wafer substrate 110. The source/drain regions 170 have a channel region 175 located between them. A first stress-inducing layer 190 is placed on a backside of the semiconductor wafer substrate 110 and is subjected to a thermal anneal to cause a stress to form in the channel region 175.

20 Claims, 12 Drawing Sheets

METHOD OF INCORPORATING STRESS INTO A TRANSISTOR CHANNEL BY USE OF A BACKSIDE LAYER

TECHNICAL FIELD OF THE INVENTION

The present invention is directed, in general, to a method of manufacturing a semiconductor device and, more specifically, to a method of incorporating stress into a transistor channel by use of a backside layer.

BACKGROUND OF THE INVENTION

The continuing push to produce faster semiconductor devices with lower power consumption has resulted in device miniaturization. In particular, smaller gate oxide thickness and silicon channel width are conducive to the low voltage and faster operation of transistor devices, such as complementary metal oxide (CMOS) transistors. With shrinking process geometries, the use of new manufacturing methods are being explored to further reduce power consumption and increase device switching speeds.

In a CMOS device, for instance, it has been found that incorporating a tensile stress into an N-type Metal Oxide Semiconductor (NMOS) transistor device increases electron mobility within the channel, and thereby, generally enhances transistor performance. This is presently accomplished by placing a tensile stress inducing layer over the NMOS device. This, in turn, allows the production of NMOS transistors having faster transistor switching speed and higher drive current. Typically, these layers have a thickness ranging from about 10 nm to about 120 nm.

Unfortunately, however, as design layouts have changed to meet the requirements for ever better transistor performance and greater speed, the use of such layers have begun to meet design limitations regarding the amount of stress that can be incorporated into the channel. For example, while a layer thicker than those presently being used could induce greater tensile stress in the channel, the use of such thicker layers is limited by design layout. This is particularly the case as component density has increased, which has caused a narrower spacing between the poly lines that form the transistor gates. When a thicker layer is used on such narrowly spaced devices, there is a resulting "pitch effect". The narrower spacings between the poly lines enhances the local stress to such an extent that the dopant diffusions of adjacent transistor structures can overrun each other, which, in turn, can cause transistor malfunction or complete transistor failure.

In addition to the problem associated with the narrower spacing, layer thickness is also limited due to hydrogen incorporation from the film into adjacent P-type Metal Oxide Semiconductor (PMOS) devices. Depending on the type of layer used, a substantial amount of hydrogen can become incorporated into the PMOS device during the layer's deposition or simply by diffusion from the layer to such an extent that it can actually "kill" the PMOS device.

Thus, due to the beneficial effects that tensile stress has on a device's performance, it would be highly desirable to increase the tensile stress within a transistor device. Unfortunately, however, the amount of stress, which is proportional to the layer's thickness, is presently limited by design layout or by its effects on adjacent PMOS devices.

Accordingly, what is needed is a method for incorporated additional tensile stress into an NMOS device that is not affected by design layout or the presence of PMOS devices.

SUMMARY OF THE INVENTION

To address the above-discussed deficiencies of the prior art, the present invention provides a method for manufacturing a semiconductor device. In one embodiment, the method includes forming source/drain regions in a substrate of a semiconductor wafer adjacent a gate structure located on a front side of the semiconductor wafer. The source/drain regions have a channel region located between them. A first stress-inducing layer is placed on a backside of the semiconductor wafer and is subjected to a thermal anneal to cause a stress to form in the channel region.

In another embodiment, there is provided a method of manufacturing an integrated circuit. This particular embodiment includes forming transistors on and within a substrate of a semiconductor wafer. The transistors include gates, wells formed within the substrate, and source/drain regions formed in the wells with each of the source/drains regions having a channel region formed therebetween. A first stress-inducing layer is placed on a backside of the semiconductor wafer and is subjected to a thermal anneal to cause a stress to form in the channel region. The method further includes forming interlevel dielectrics over the transistors and forming interconnects in the interlevel dielectrics that interconnect the transistors to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
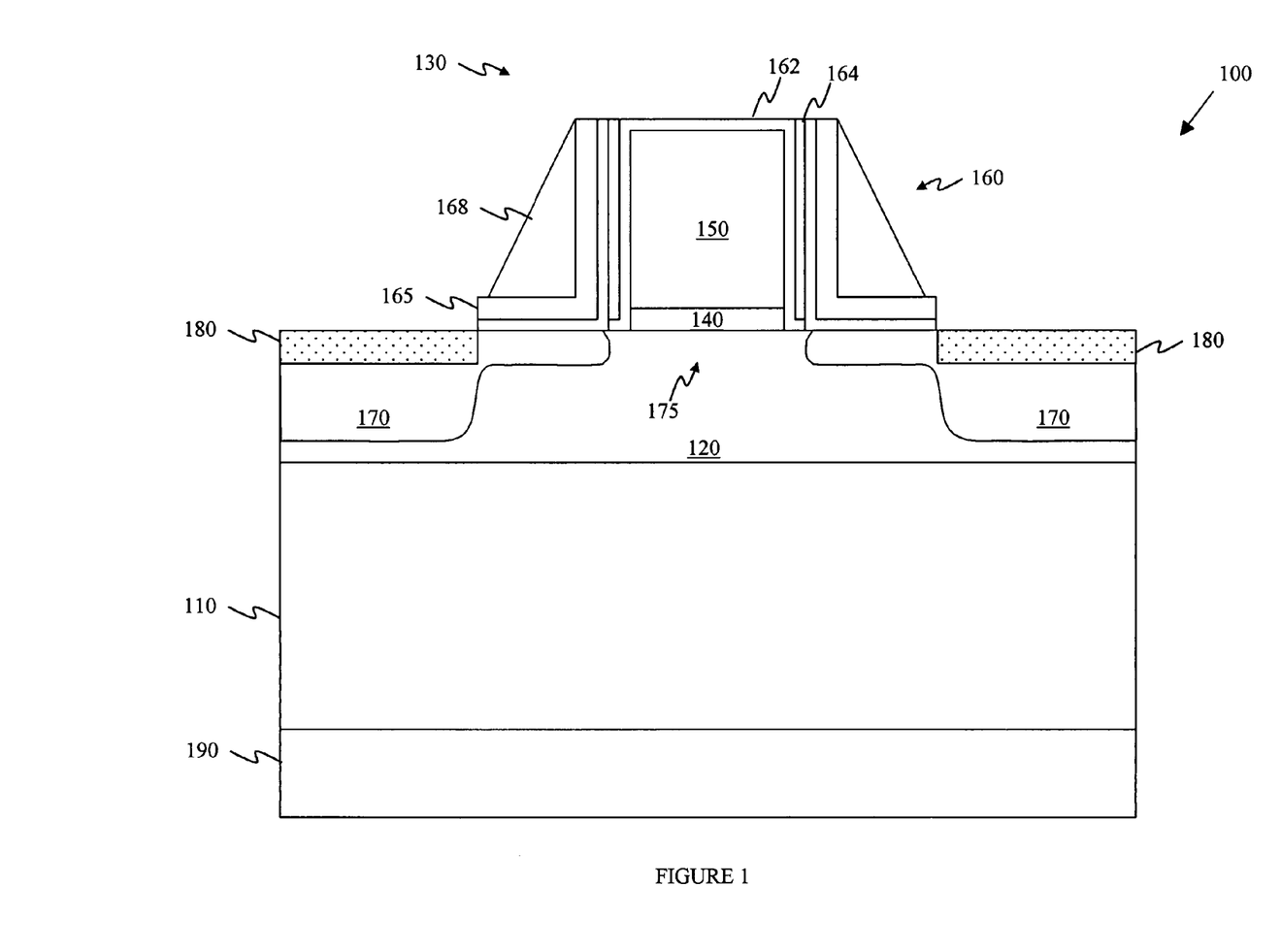
FIG. 1 illustrates a sectional view of one embodiment of a semiconductor device constructed according to an embodiment of the present invention.

Referring initially to FIG. 1, illustrated is a sectional view of one embodiment of a semiconductor device 100 constructed according to an embodiment of the present invention. In the embodiment illustrated in FIG. 1, the semiconductor device 100 includes a substrate 110, such as a semiconductor silicon wafer. Located within the substrate 110 in the embodiment of FIG. 1 is a well region 120. Additionally located over a front side of the substrate 110 and well region 120 is a gate structure 130.

The gate structure 130 illustrated in FIG. 1 is of conventional design and includes a gate oxide 140 located over the substrate 110, as well as a gate electrode 150 located over the gate oxide 140. The gate electrode 150 may have a variety of thicknesses, nonetheless, a thickness ranging from about 50 nm to about 150 nm is exemplary. The gate electrode 150, when constructed in accordance with the principles of the present invention, may comprise a number of different materials. For instance, in the illustrative embodiment shown in FIG. 1 the gate electrode 150 comprises a polysilicon, but other material used to construct gate electrode is also within the scope of the present invention.

The gate electrode 150 may also include a dopant or combination of several types of dopants therein. The dopant, such as boron, phosphorous, arsenic or another similar dopant, based on whether the semiconductor device 100 is operating as a PMOS device or an NMOS device, is configured to tune the minimum energy required to bring an electron from the Fermi level to the vacuum level, or the so called work function.

The gate structure 130 further includes gate sidewall spacers 160 flanking both sides of the gate electrode 150 and gate oxide 140. The gate sidewall spacers 160 in the embodiment of FIG. 1 each include a number of different layers. For instance, the gate sidewall spacers 160, among other layers, includes an oxide layer 162 that extends over the gate electrode 150. Adjacent the oxide layer 162 is a nitride layer 164. The oxide layer 162 and the nitride layer 164 are the layers that serve as an offset spacer during formation of the lightly doped drains (LDD). The gate sidewall spacer 160 further includes include L-shaped nitride spacers 165 and sidewall oxides 168. The gate sidewall spacers 160 may be of conventional formed and comprise many different types and numbers of layers while staying consistent with the principles of the present invention.

The semiconductor device 100 illustrated in FIG. 1 additionally includes conventional source/drain regions 170, which include LDD extensions, located within the substrate 110 and proximate the gate oxide 140. A channel region 175 is located between the source/drain regions 170. Located within the source/drain regions 170 are conventional silicided source/drain contact regions 180. The silicided source/drain contact regions 180 in this embodiment comprise nickel silicided source/drain contact regions 180. Nonetheless, other silicidation materials could be used to form the silicided source/drain regions 180 and remain within the scope of the present invention. The silicided source/drain contact regions 180 may have a depth into the source/drain regions 170 ranging from about 10 nm to about 30 nm, among others.

Located on the backside of the semiconductor substrate 110 is a stress-inducing layer 190. The stress-inducing layer preferably imparts a stress into the channel region 175. Depending on the way in which it is deposited and the materials used, the stress exerted on the backside of the semiconductor substrate 110 may be a compressive stress or a tensile stress. In an advantageous application, the stress imparted by the stress-inducing layer 190 is a compressive stress which translates into a tensile stress in the channel region 175. In those embodiments where the semiconductor device 100 is an NMOS device, a compressive layer on the backside of the semiconductor substrate 110 is particularly advantageous because the translated tensile stress in the channel region 175 increases electron mobility within the channel, thereby enhancing device performance. Various materials capable of imparting a stress to the backside of the semiconductor substrate 110 may be used. For example, the stress-inducing layer 190 may be a silicon nitride layer. Alternatively, the stress-inducing layer 190 may be a silicon oxide layer, a silicon carbide layer or a silicon/carbide/nitride layer.

An advantage offered by the stress-inducing layer 190 in the present invention is that while the thickness of conventional front side layers are limited because of design layouts, the present invention has no such limitations because the stress-inducing layer is located on the backside of the semiconductor substrate 110. Thus, the stress-inducing layer 190 can be used to significantly increase the stress imparted to the channel region 175 to increase electron mobility beyond what is presently achievable with conventional processes. Moreover, the stress-inducing layer 190 can be used in conjunction with other conventional stress-inducing layers located on the front side of the semiconductor substrate 110 to impart additional stress into the channel and further enhance electron mobility.

Figure 2:
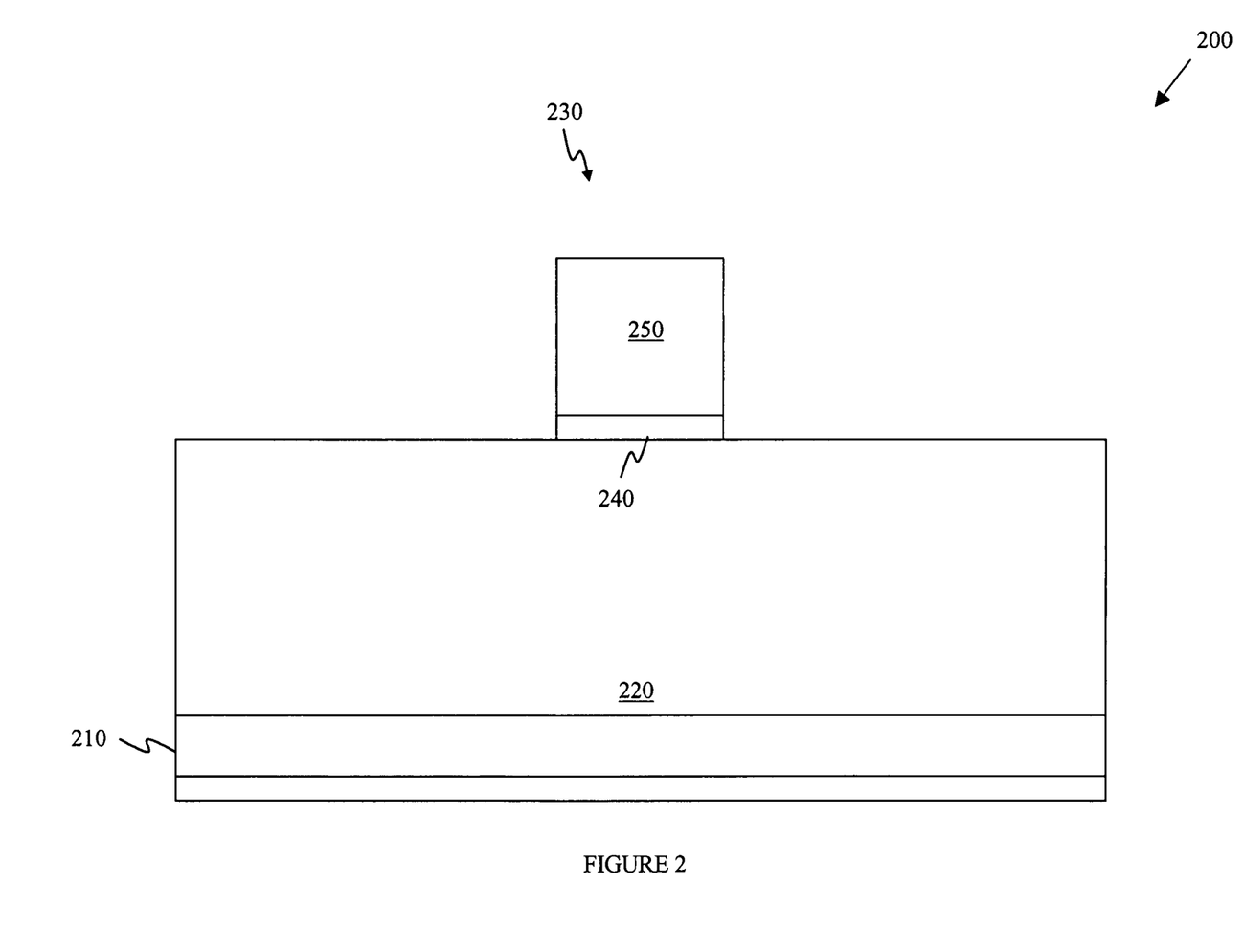
FIG. 2 illustrates a sectional view of a partially completed semiconductor device 200 at an early stage with a gate electrode being formed.

Turning now to FIGS. 2-11, illustrated are sectional views of selected detailed manufacturing steps instructing how one might, in an advantageous embodiment, manufacture a semiconductor device similar to the semiconductor device 100 depicted in FIG. 1. FIG. 2 illustrates a sectional view of a partially completed semiconductor device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention.

Located within the substrate 210 in the embodiment shown in FIG. 2 is a well region 220 that can be further doped to achieve either an NMOS or PMOS device. Located over the substrate 210 in the embodiment of FIG. 2 is a gate structure 230. The gate structure 230 includes a conventionally formed gate oxide 240 and a conventionally formed gate electrode 250, such as a doped polysilicon gate.

Figure 3:
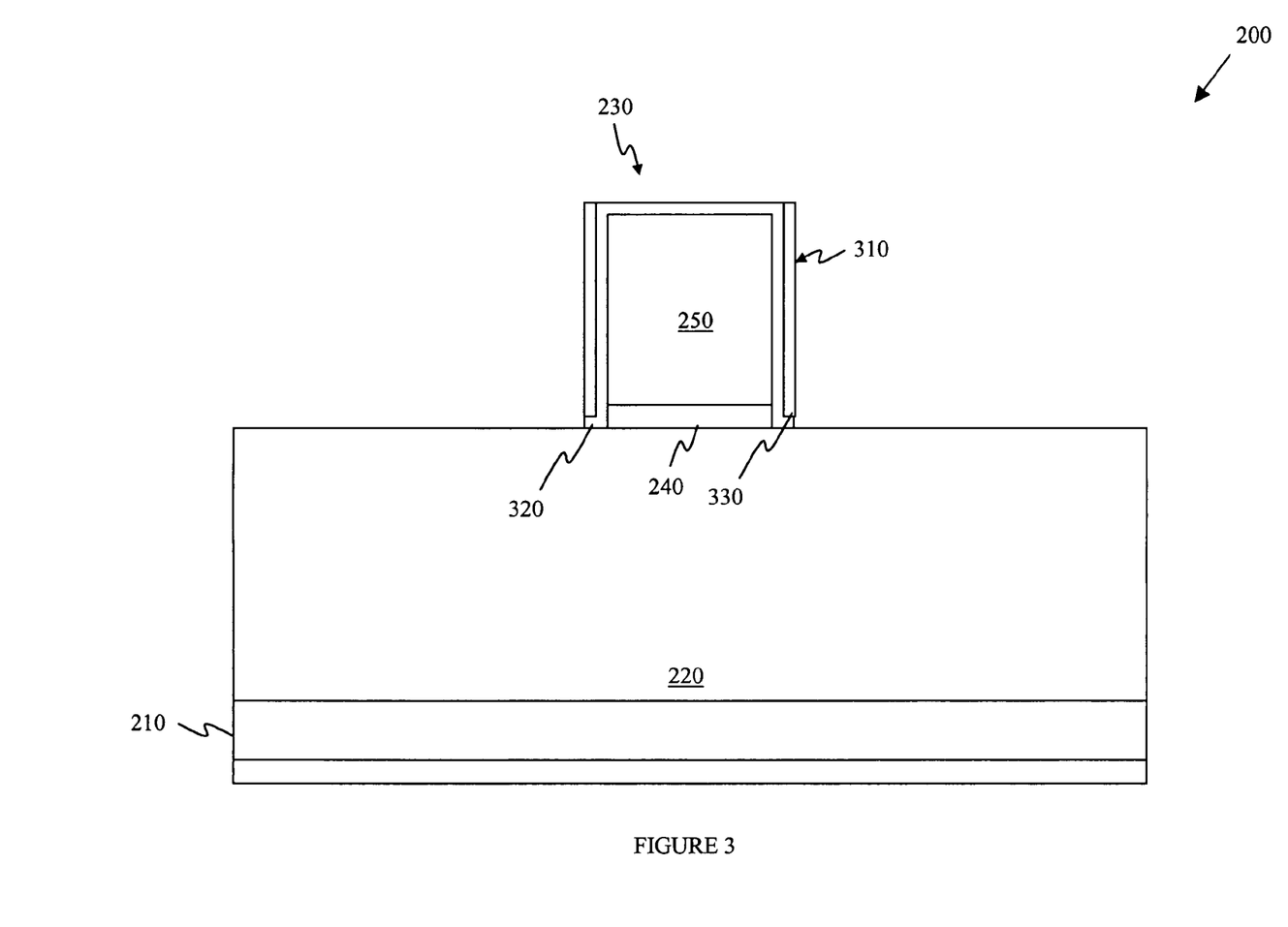
FIG. 3 illustrates a sectional view of the partially completed semiconductor device illustrated in FIG. 2 after conventional formation of portions of gate sidewall spacers.

Turning briefly to FIG. 3 illustrated is a sectional view of the partially completed semiconductor device 200 illustrated in FIG. 2 after conventional formation of portions of gate sidewall spacers 310. The portions of the gate sidewall spacers 310 shown in FIG. 3 include an oxide layer 320 and a nitride spacer 330 that form an offset spacer that can be used to offset a LDD implant, as discussed below.

Figure 4:
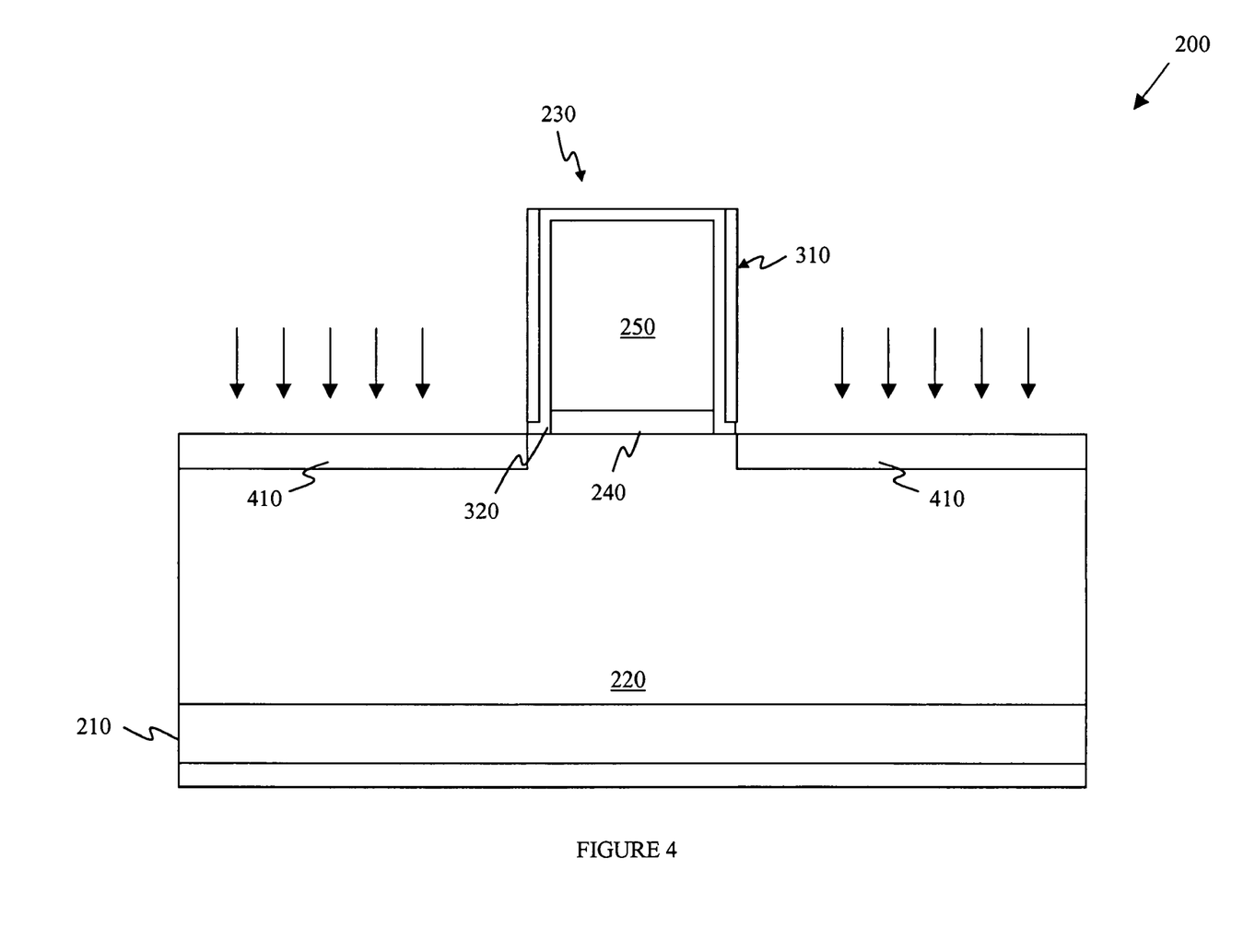
FIG. 4 illustrates a sectional view of the partially completed semiconductor device illustrated in FIG. 3 after formation of lightly doped extension implants within the substrate.

Turning now to FIG. 4, illustrated is a sectional view of the partially completed semiconductor device 200 illustrated in FIG. 3 after formation of LDD implants 410 within the substrate 210. The LDD implants 410 are conventionally formed and generally have a peak dopant concentration ranging from about 1E19 atoms/cm$^3$ to about 2E20 atoms/cm$^3$. As is standard in the industry, the LDD implants 410 have a dopant type opposite to that of the well region 220 in which they are located. Accordingly, in an NMOS device, the LDD implants 410 may be doped with an N-type dopant in the illustrative embodiment shown in FIG. 4. As seen at this particular point of fabrication, the stress-inducing layer discussed above has not yet been deposited. However, it should be understood that it could be deposited at this point in the manufacturing process, if so desired.

Figure 5:
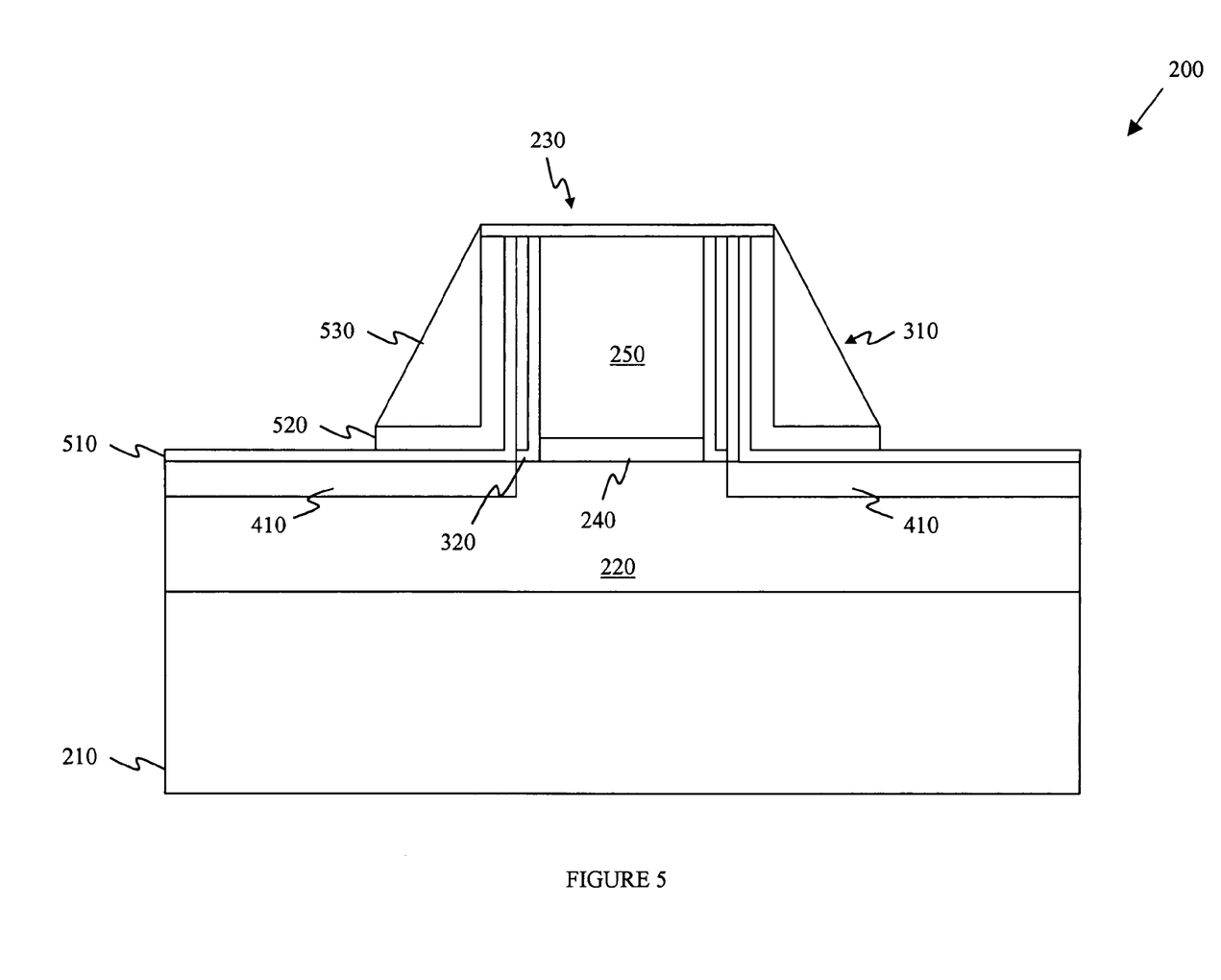
FIG. 5 illustrates a sectional view of the partially completed semiconductor device illustrated in FIG. 4 after conventional formation of the remaining portions of the gate sidewall spacers.

Turning now to FIG. 5, illustrated is a sectional view of the partially completed semiconductor device 200 illustrated in FIG. 4 after conventional formation of the remaining portions of the gate sidewall spacers 310. Particularly, a cap oxide 510, L-shaped nitride spacers 520 and sidewall oxides 530 complete the gate sidewall spacers 310. The cap oxide 510, among other purposes, has the job of preventing the L-shaped nitride spacers 520 from directly contacting the substrate 210. Most likely, the cap oxide 510 will be deposited over the partially completed semiconductor device 200 using chemical vapor deposition (CVD).

Figure 6:
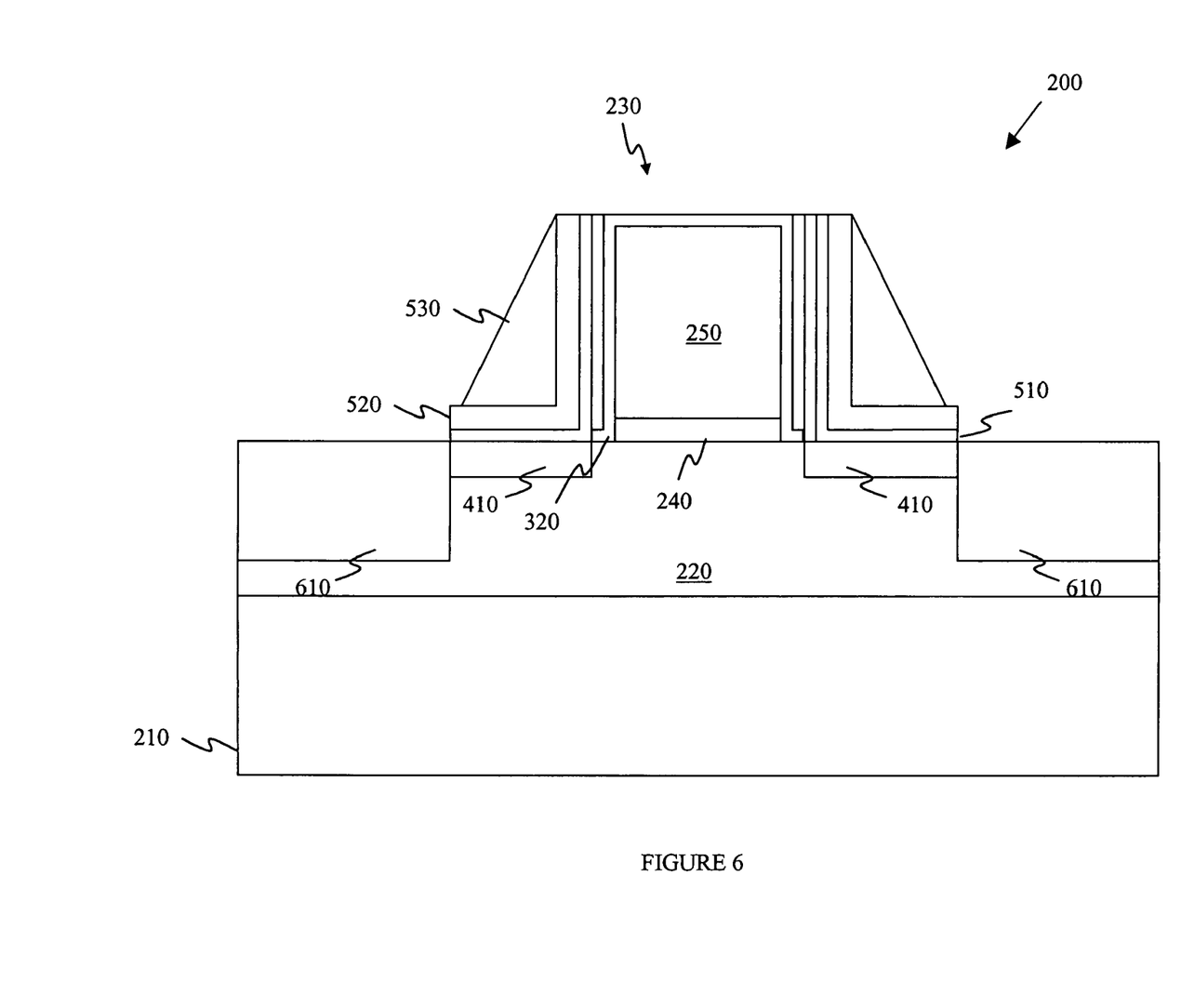
FIG. 6 illustrates a sectional view of the partially completed semiconductor device illustrated in FIG. 5 after formation of highly doped source/drain implants within the substrate.

Turning now to FIG. 6, illustrated is a sectional view of the partially completed semiconductor device 200 illustrated in FIG. 5 after formation of highly doped source/drain implants 610 within the substrate 210. The formation of the highly doped source/drain implants 610 is also conventional. Generally the highly doped source/drain implants 610 have a peak dopant concentration ranging from about 1E18 atoms/cm$^3$ to about 1E21 atoms/cm$^3$. Also, the highly doped source/drain implants 610 should typically have a dopant type opposite to that of the well region 220 in which hey are located. Accordingly, in the illustrative embodiment shown in FIG. 6, the highly doped source/drain implants 610 are doped with an N-type dopant.

Figure 7:
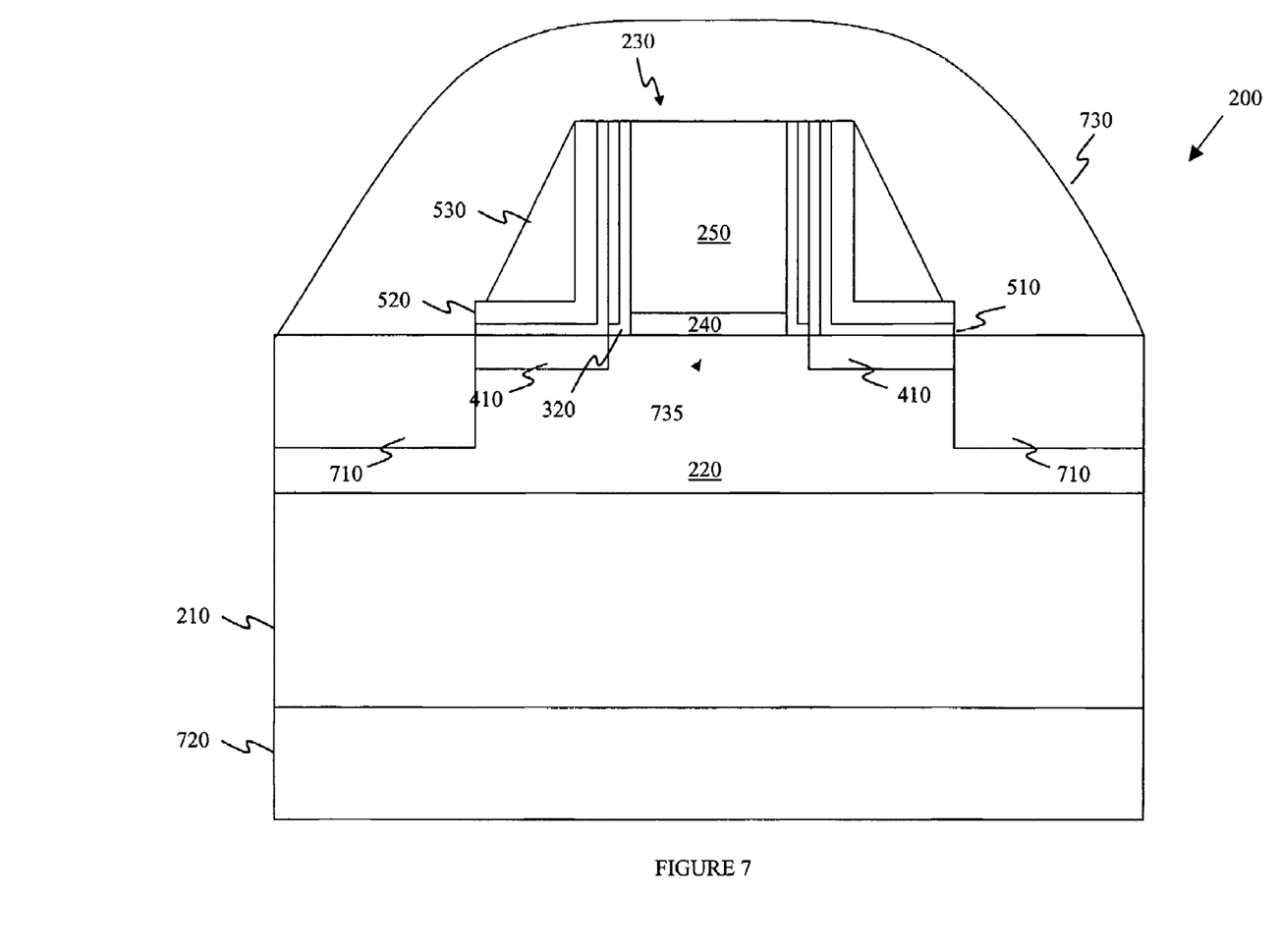
FIG. 7 illustrates a sectional view of the partially completed semiconductor device illustrated in FIG. 6 after formation of a stress-inducing layer on the backside of the semiconductor substrate and formation of an optional stress-inducing layer on the front side of the semiconductor substrate.

Turning now to FIG. 7, illustrated is a sectional view of the partially completed semiconductor device 200 illustrated in FIG. 6 after formation of a stress-inducing layer 720 on the backside of the semiconductor substrate 210 and formation of an optional stress-inducing layer 730 on the front side of the semiconductor substrate 210. The second stress-inducing layer 730 need not be present, but in an advantageous embodiment, it is present. Preferably, the stress-inducing layers 720 and 730 are deposited in such a way that they both impart a tensile stress into the channel region 735. However, if a particular application so required, the stress-inducing layer 720 and 730 could be deposited to impart a compressive stress. In an advantageous embodiment, the stress-inducing layer 730 is deposited before the stress-inducing layer 720 and serves as a protective coating for the PMOS and NMOS devices during the deposition of the stress-inducing layer 720. In either case, the stress that each layer imparts becomes additive.

The stress-inducing layer 720 may be deposited in such a way as to impart a compressive stress to the backside of the semiconductor wafer 210, which as explained below translates into a tensile stress being imparted to the channel region 735. The stress-inducing layer 730, on the other hand, may be deposited on the front side of the semiconductor wafer 210 as a tensile layer, which would also impart a tensile stress to the channel region 735. Thus, each would impart a tensile stress to the channel region 735, and their stress values would be added to each other. Thus, by employing both layers, additional stress could be placed in the channel region 735, which would result in an increase in electron mobility within the channel region 735. Whether the stress-inducing layer 720, 730 is a compressive layer or tensile layer, and how much stress is associated with the stress-inducing layers 720, 730 depends on the materials and the way in which the layers are deposited, and one skilled in the art, given the teachings herein would know how to achieve the desired layer. Moreover, it should be noted that, depending on the embodiment, the stress-inducing layer 730 may be completely removed or only partially removed from either the PMOS or NMOS device to obtain a different stress those respective devices.

By way of example only, a compressive layer may be achieved by depositing a silicon nitride layer using a plasma enhanced chemical vapor deposition process (PECVD). In such a PECVD process, the deposition is accomplished by depositing at a temperature of about 480° C., using a gas flow of silane (SiH$_4$) having a flow rate of about 120 sccms and ammonium (NH$_3$) having a flow rate of about 400 sccm. The deposition may be conducted at a pressure of about 2.0 torr and using a high frequency RF power of about 50 W and a low Frequency RF power of about 50 W. The deposition time may run for about 300 seconds to achieve a layer having a thickness of about 500 nm. The above exemplary conditions achieves a stress-inducing layer capable of generating in excess of 1 giga Pascal of compressive force. It should be understood, however, that these deposition conditions may be varied to achieve a stress-inducing layer having different forces associated with it and different thickness. In an exemplary embodiment, the stress-inducing layer 720 has a thickness that ranges from about 30 nm up to and in excess of 2000 nm.

Alternatively, a tensile layer may be achieved by also depositing a silicon nitride layer using a plasma enhanced chemical vapor deposition process (PECVD). In such a PECVD process, the deposition is accomplished by depositing at a temperature of about 480° C., using a gas flow of silane (SiH$_4$) having a flow rate of about 120 sccms and ammonia (NH$_3$) having a flow rate of about 2900 sccm. The deposition may be conducted at a pressure of about 4.0 torr and using a high frequency RF power of about 50 W and a low Frequency RF power of about 15 W. The deposition time may run from for 400 seconds to achieve a layer having a thickness of about 500 nm. The above exemplary conditions achieves a stress-inducing layer capable of generating in excess of 1 giga Pascal of tensile force. Again, it should be understood, however, that these deposition conditions may be varied to achieve a stress-inducing layer having different forces associated with it, as well as different thickness. In an exemplary embodiment, the stress-inducing layer 730 has a thickness that ranges from about 30 nm up to about 50 nm.

Figure 8:
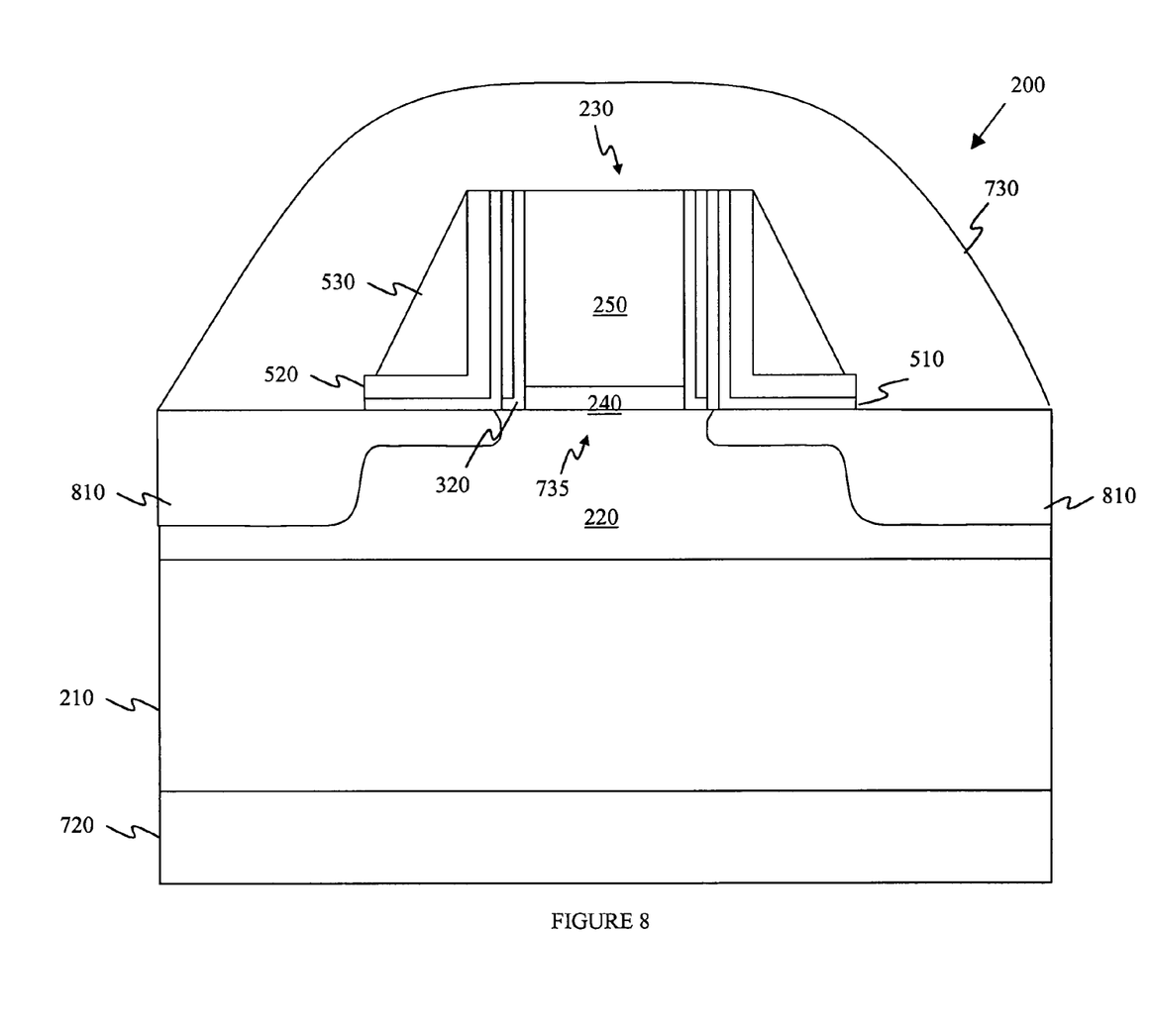
FIG. 8 is a sectional view of the semiconductor device of FIG. 7 after subjecting the semiconductor device to a standard source/drain anneal, thereby activating source/drain regions, including the LDD regions, to form source/drains.

Turning now to FIG. 8, there is a sectional view of the semiconductor device 200 of FIG. 7 after subjecting the semiconductor device 200 to a standard source/drain anneal, thereby activating source/drain regions 710, including the LDD regions to form source/drains 810. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drains regions 710.

In addition to activating the source/drains 810, in an advantageous embodiment, the above-discussed anneal also locks or settles the stress generated by the stress-inducing layer 720 and 730, when present, into the channel region 735 located between the source/drains 810. However, the stress may also be locked in by a subsequent anneal. For example, in some processes, the anneal is conducted in several steps and the stress could be locked in during the last step or by a different anneal altogether. In an exemplary embodiment, the stress-inducing layer 720 imparts a compressive stress to the backside of the semiconductor wafer 210. Because of the way in which the stress-inducing layer 720 is deposited and because it is on the backside, the compressive stress is translated into a tensile stress within the channel region 735. This is particularly advantageous when the semiconductor device 200 is an NMOS device because it is this type of device that particularly benefits from a tensile stress in the channel region 735.

Figure 9:
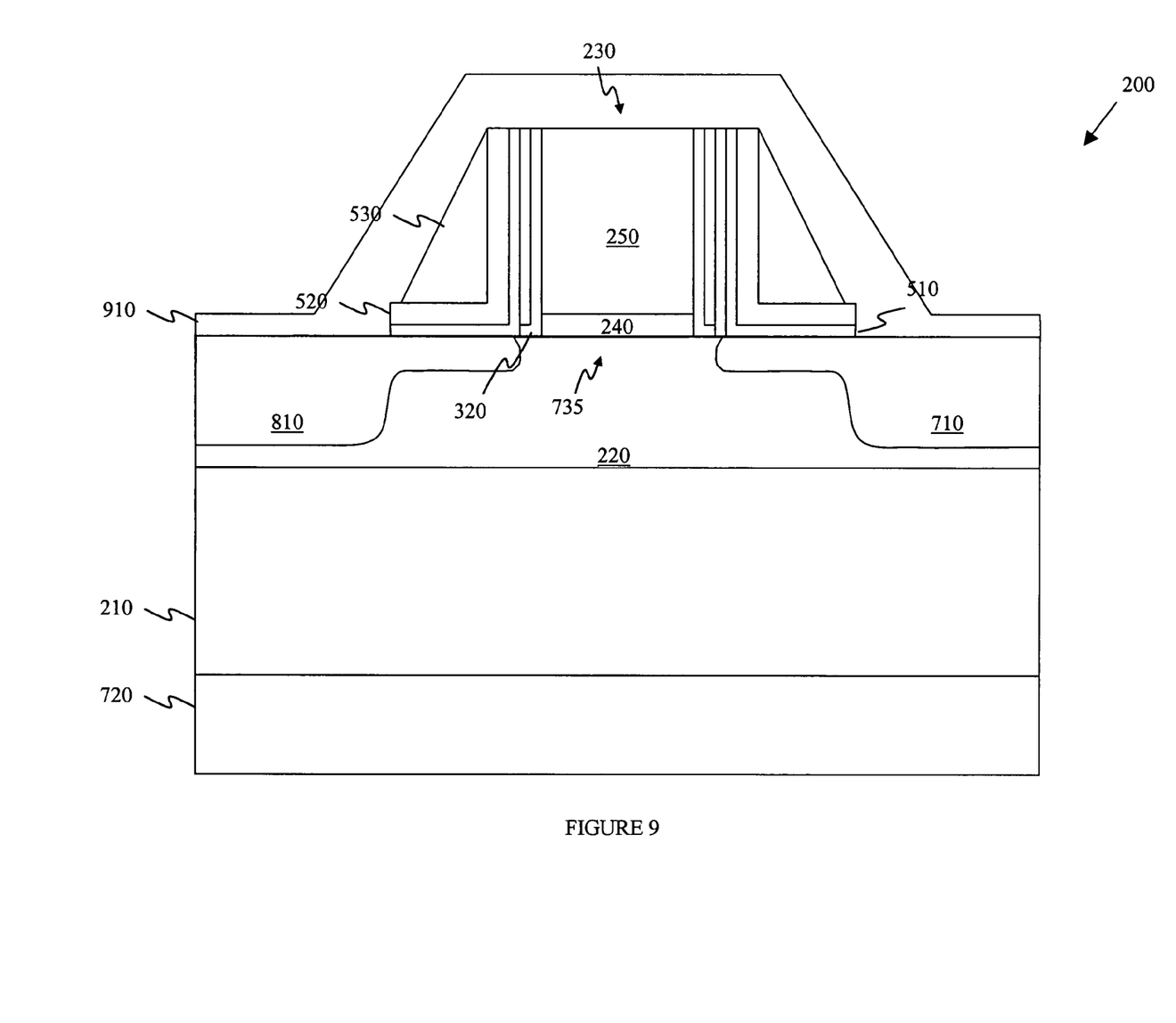
FIG. 9 is a sectional view of the semiconductor device of FIG. 8 after the conventional removal of the stress-inducing layer that was located on the front side of the semiconductor substrate and conventional deposition of a source/drain silicidation layer over the entire surface of the partially completed semiconductor device.

Turning now to FIG. 9, there is illustrated a sectional view of the semiconductor device 200 after the conventional removal of the stress-inducing layer 730 that was located on the front side of the semiconductor substrate 210 and conventional deposition of a source/drain silicidation layer 910 over the entire surface of the partially completed semiconductor device 200. It should be noted that either of the stress-inducing layers 720 and 730 can be removed after the stress associated with each of these layers is incorporated into the channel region by the thermal anneal. In this particular embodiment, however, the stress-inducing layer 730 that was located on the front side of the semiconductor wafer 210 is conventionally removed so that silicided contacts can be formed for the source/drains 810. As seen in this particular embodiment, the stress-inducing layer 720 remains on the backside of the semiconductor wafer 210. While, this layer could be removed with the stress-inducing layer 730, it is believed that it is advantageous to leave the stress-inducing layer 720 in place until back grinding takes place at the end of the back line process.

The source/drain silicidation layer 910 in the embodiment shown in FIG. 9 happens to be a thin nickel layer, however, other materials that react with silicon to form a silicide could easily be used. The source/drain silicidation layer 910 of FIG. 9 was conventionally deposited to a thickness ranging from about 4 nm to about 20 nm.

Figure 10:
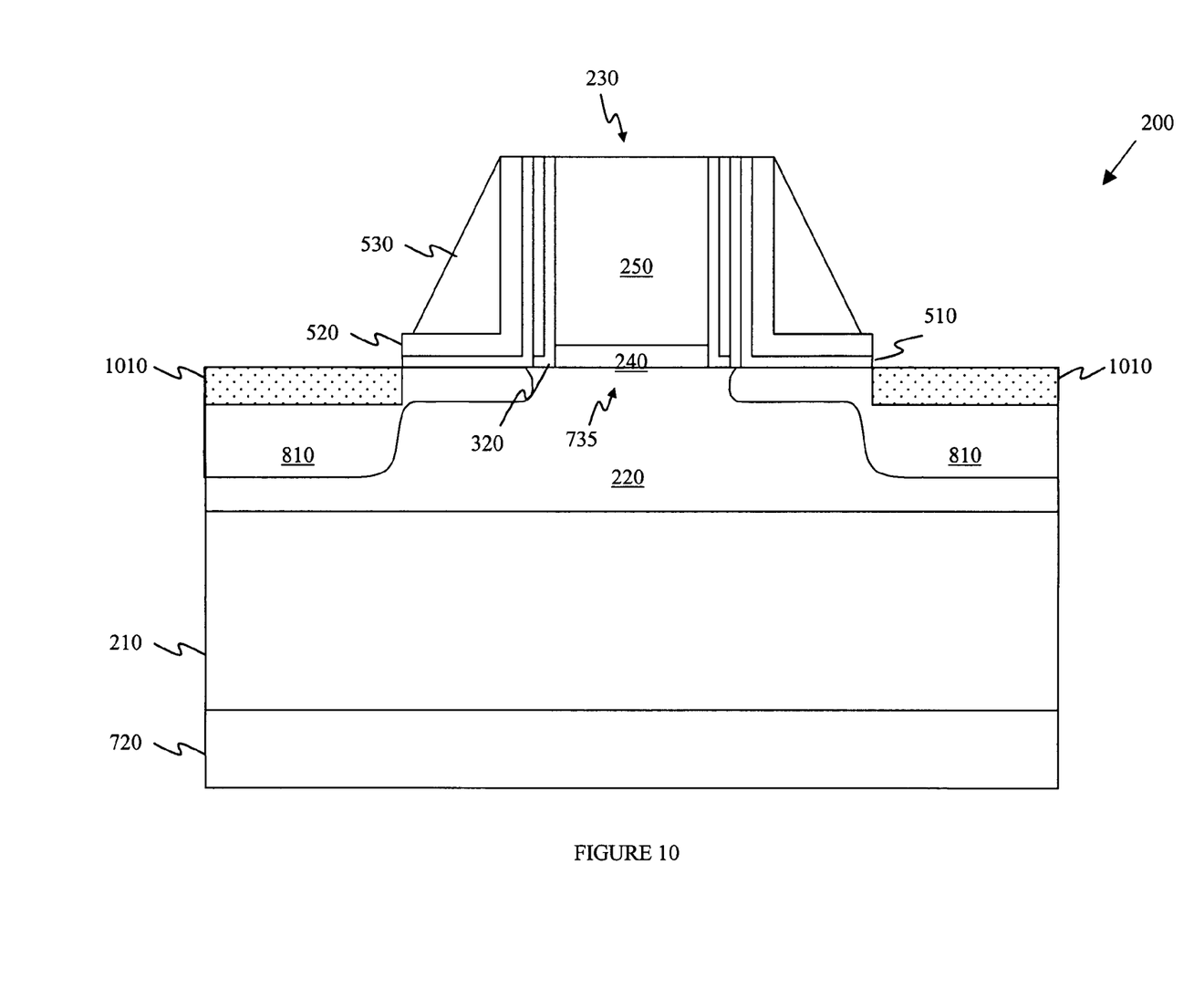
FIG. 10 is a sectional view of the partially completed semiconductor device illustrated in FIG. 9 after subjecting it to a silicidation process.

Turning now to FIG. 10, illustrated is a sectional view of the partially completed semiconductor device 200 illustrated in FIG. 9 after subjecting it to a second RTA process. This second RTA process attempts to cause the source/drain silicidation layer 910 to react with the silicon of the source/drains 810 to form silicided source/drain contacts 1010. In the instance where the source/drain silicidation layer 1010 comprises nickel, the second RTA process causes the nickel to react with the silicon to form a nickel silicide.

The thermal anneal process may be conducted using a variety of different temperatures and times. Nonetheless, it is believed that the thermal anneal, in an exemplary embodiment, should be conducted in a rapid thermal processing tool at a temperature ranging from about 400° C. to about 600° C. for a time period ranging from about 5 seconds to about 60 seconds. The specific temperature and time period are typically based, however, on the ability to form the silicided source/drain contacts 1010 to a desired depth, as well as the silicide materials selected. Moreover, it is desirable that the anneal temperature not exceed 900° C. because of the possibility of removing the stress previously locked in the channel region 735, as described above.

After completing the silicided source/drain contacts 1010, the partially completed semiconductor device 200 is subjected to a selective removal process. For instance, in one embodiment of the invention the device could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the source/drain silicidation layer 910. Thereafter the manufacture of the partially completed semiconductor device 200 would continue in a conventional manner, optimally resulting in a device similar to the semiconductor device 100 illustrated in FIG. 1.

It should be noted that the exact order of the steps illustrated with respect to FIGS. 2-11 may change depending on the process flow. Additionally, various other steps could be added to the description of FIGS. 2-11.

Figure 11:
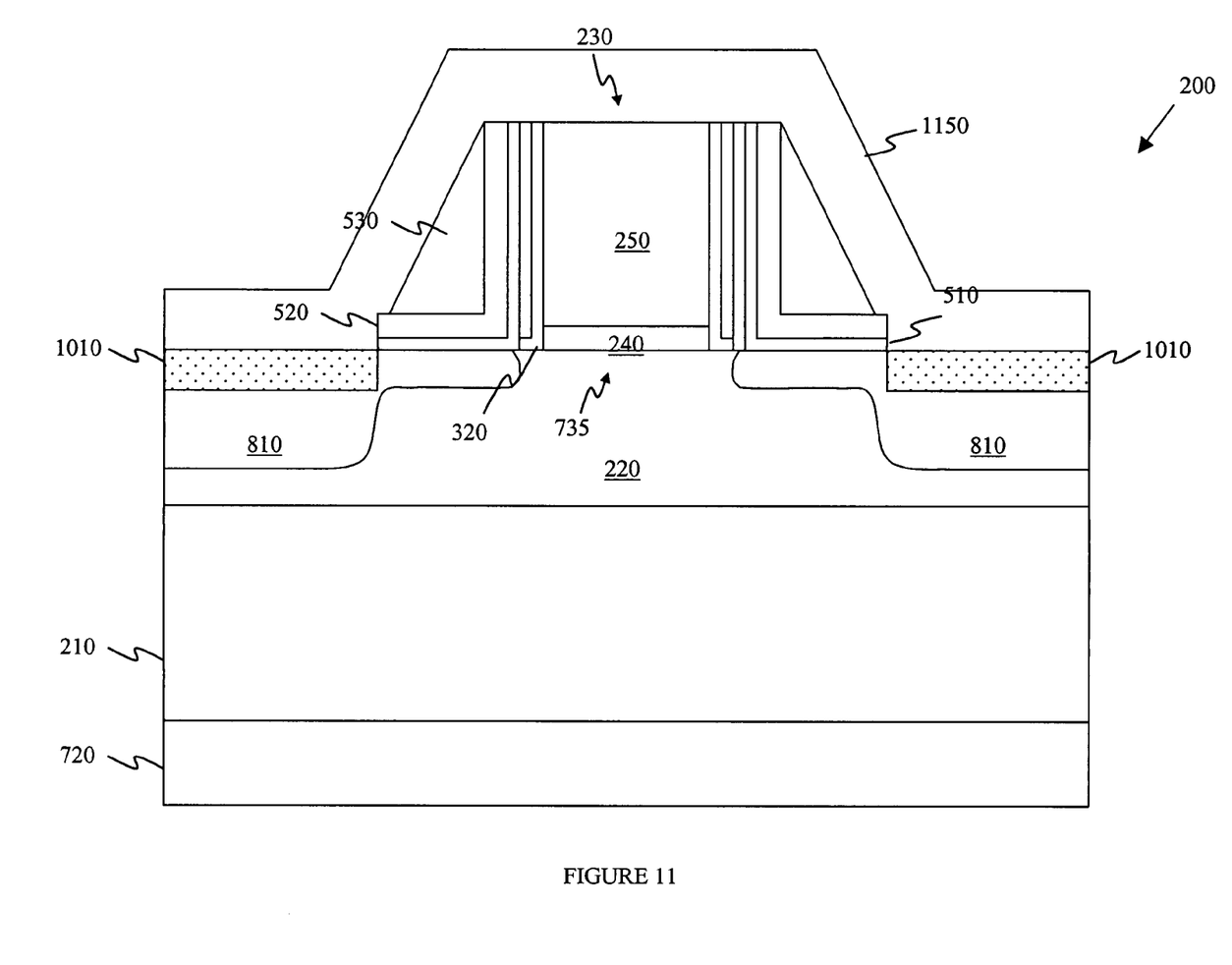
FIG. 11 is a sectional view of the partially completed semiconductor device illustrated in FIG. 10 after the formation of the PMD liner nitride.

Turning now to FIG. 11, is a sectional view of the semiconductor device 200 of FIG. 10 after the conventional deposition of a PMD liner silicon nitride layer 1150. This layer is used as the contact etch stop layer. In addition the stress of the nitride can be engineered to be highly tensile (helping NMOS transistors) or highly compressive (helping PMOS transistors) for enhancement of electron/hole mobility in the channel. Since the thickness of the PMD liner layer (and therefore the stress) is also limited by the layout and the density of the transistors, it is highly beneficial to have the backside stress-inducing layer even though the stress can be engineered from the front side.

Alternatively, the backside stress-inducing layer can be deposited prior to the PMD liner deposition rather than the source/drain activation anneal, if the backside film is unstable when subjected to aggressive thermal budget.

Figure 12:
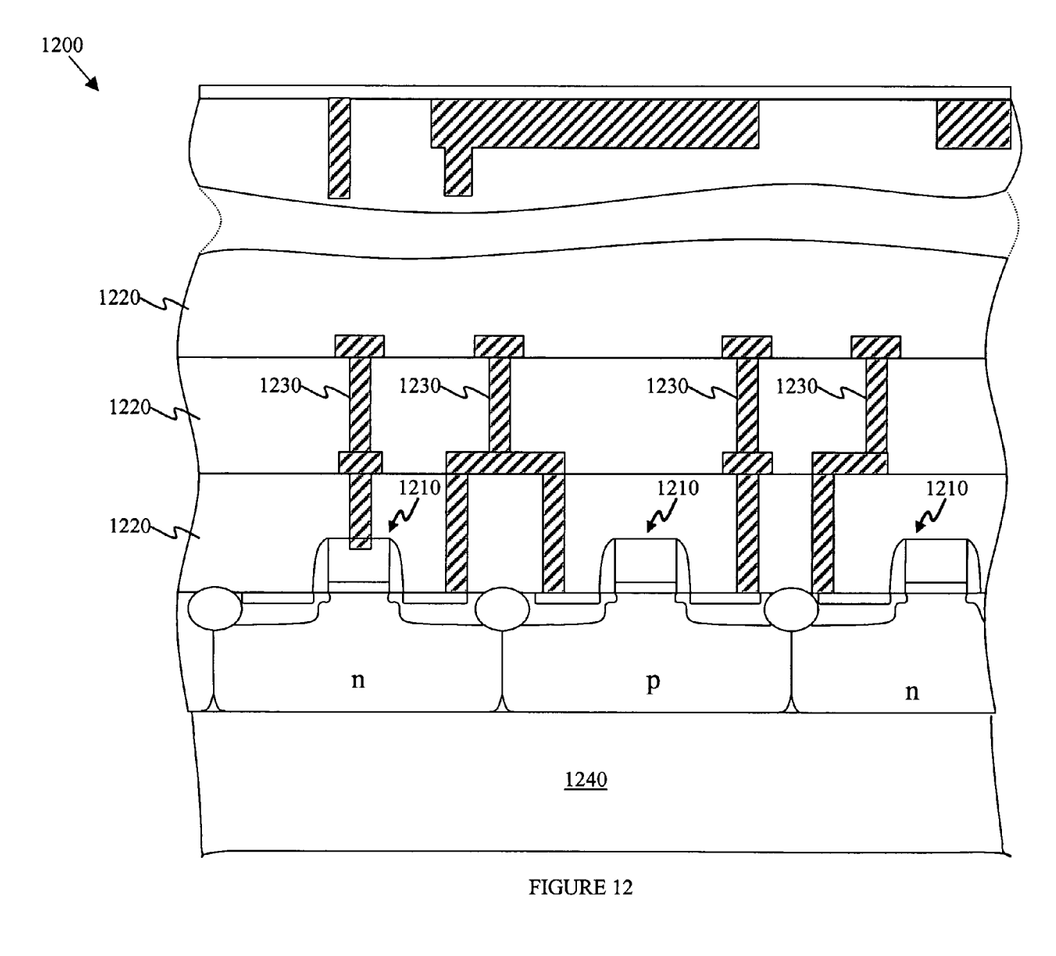
FIG. 12 illustrates an exemplary cross-sectional view of an integrated circuit (IC) incorporating devices constructed according to the principles of the present invention.

Referring finally to FIG. 12, illustrated is an exemplary sectional view of an integrated circuit (IC) 1200 incorporating devices 1210 constructed according to the principles of the present invention. The IC 1200 may include devices, such as transistors used to form CMOS devices, BiCMOS devices, Bipolar devices, as well as capacitors or other types of devices. The IC 1200 may further include passive devices, such as inductors or resistors, or it may also include optical devices or optoelectronic devices. Those skilled in the art are familiar with these various types of devices and their manufacture. In the particular embodiment illustrated in FIG. 11, the IC 1200 includes the devices 1210 having dielectric layers 1220 located thereover. Additionally, interconnect structures 1230 are located within the dielectric layers 1220 to interconnect various devices, thus, forming the operational integrated circuit 1200. It should be further noted that the stress-inducing layer 720 that had previously been located on the backside of the semiconductor substrate 1240 has been removed by conventional back grinding processes.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:

forming source/drain regions in a substrate of a semiconductor wafer adjacent a gate structure located on a front side of the semiconductor wafer, the source/drain regions having a channel region located therebetween;

placing a first stress-inducing layer on a backside of the semiconductor wafer, wherein the first stress-inducing layer is a first layer deposited on the backside of the semiconductor wafer such that the first stress-inducing layer resides only on the backside of the semiconductor wafer;

subjecting the first stress-inducing layer to a thermal anneal to cause a stress to form in the channel region; and placing a second stress-inducing layer over the gate and source/drain regions wherein the second stress-inducing layer imparts a tensile stress to channel region.

2. The method as recited in claim 1 wherein subjecting activates the source/drain regions.

3. The method as recited in claim 2 wherein a temperature of the thermal anneal ranges from about 1000° C. to about 1100° C.

4. The method as recited in claim 1 wherein the first stress-inducing layer imparts a compressive stress to the backside of the semiconductor wafer and imparts a tensile stress to the channel region.

5. The method as recited in claim 4 further including placing a second stress-inducing layer over the gate and source/drain regions wherein the second stress-inducing layer imparts a compressive stress to the channel region.

6. The method as recited in claim 1 wherein placing the second stress-inducing layer includes forming the second stress-inducing layer to a thickness ranging from about 30 nm to about 100 nm.

7. The method as recited in claim 1 wherein subjecting the first stress-inducing layer to a thermal anneal includes forming a tensile stress in the channel.

8. The method as recited in claim 1 wherein at least one of the first stress-inducing layer and the second stress-inducing layer is a silicon nitride layer.

9. The method as recited in claim 1 wherein the first stress-inducing layer is a silicon oxide layer.

10. The method as recited in claim 1 wherein the first stress-inducing layer is a silicon carbide layer or a silicon/carbide/nitride layer.

11. The method as recited in claim 1 wherein placing the first stress-inducing layer on a backside of the semiconductor wafer includes forming a first stress-inducing layer having a thickness ranging from about 30 nm to about 2000 nm.

12. The method as recited in claim 1 wherein the first stress-inducing layer imparts a tensile stress to the backside of the semiconductor wafer and imparts a compressive stress to the channel region.

13. The method as recited in claim 1 wherein placing the first stress-inducing layer comprises depositing the first stress-inducing layer only on the backside of the wafer.

14. A method of manufacturing an integrated circuit, comprising:

forming transistors on and within a substrate of a semiconductor wafer, the transistors including completed gates, wells formed within the substrate and source/drain regions formed in the wells with each of the source/drains regions having a channel region formed therebetween;

subsequent to forming the transistors, placing a first stress-inducing layer on a backside of the semiconductor wafer;

placing a second stress-including layer over the gate and source drain regions wherein the second stress-inducing layer imparts a same type stress as said first stress-inducing layer;

subjecting the first and second stress-inducing layer to a thermal anneal to cause a stress to form in the channel region, wherein the first stress-inducing layer imparts a compressive stress to the backside of the semiconductor wafer and imparts a tensile stress to the channel region and the second stress-inducing layer imparts a tensile stress to the channel region;

forming interlevel dielectrics over the transistors; and forming interconnects in the interlevel dielectrics that interconnect the transistors to form an operative integrated circuit.

15. The method as recited in claim 14 wherein subjecting activates the source/drain regions and a temperature of the thermal anneal ranges from about 1000° C. to about 1100° C.

16. The method as recited in claim 14 wherein placing the second stress-inducing layer includes forming the second stress-inducing layer to a thickness ranging from about 30 nm to about 100 nm.

17. The method as recited in claim 14 wherein the tensile stress imparted by the first and second stress-inducing layers are additive.

18. The method as recited in claim 14 wherein subjecting the first stress-inducing layer to a thermal anneal includes forming a tensile stress in the channel.

19. The method as recited in claim 14 wherein the first stress-inducing layer is a silicon nitride layer, a silicon oxide layer, a silicon carbide layer or a silicon/carbide/nitride layer.

20. The method as recited in claim 14 wherein placing the first stress-inducing layer on a backside of the semiconductor wafer includes forming a first stress-inducing layer having a thickness ranging from about 30 nm to about 200 nm.

\* \* \* \* \*